United States Patent
Carey et al.

(10) Patent No.: US 12,108,560 B2
(45) Date of Patent: Oct. 1, 2024

(54) COMPUTING CHASSIS INCLUDING ACOUSTICAL BAFFLES

(71) Applicant: Dell Products L.P., Round Rock, TX (US)

(72) Inventors: Daniel J. Carey, Austin, TX (US); Evangelos Konstantinos Koutsavdis, Leander, TX (US); Chris E. Peterson, Austin, TX (US); Paul Allen Waters, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 184 days.

(21) Appl. No.: 17/648,191

(22) Filed: Jan. 18, 2022

(65) Prior Publication Data

US 2023/0232570 A1 Jul. 20, 2023

(51) Int. Cl.
*H05K 7/20* (2006.01)
*G10K 11/16* (2006.01)
*G11B 33/14* (2006.01)

(52) U.S. Cl.
CPC ....... *H05K 7/20145* (2013.01); *G10K 11/161* (2013.01); *G11B 33/142* (2013.01)

(58) Field of Classification Search
CPC ....... H05K 7/20145; G06F 1/182; G06F 1/20; G10K 11/161; G11B 33/142
See application file for complete search history.

(56) References Cited

U.S. PATENT DOCUMENTS

| | | | | |
|---|---|---|---|---|
| 7,286,348 B2* | 10/2007 | Vinson | ............... | H05K 7/20136 |
| | | | | 361/695 |
| 10,403,328 B2* | 9/2019 | Albrecht | ............... | G11B 33/142 |
| 10,453,436 B2* | 10/2019 | Chen | ............... | G10K 11/175 |
| 10,468,010 B2* | 11/2019 | Chen | ............... | F16L 55/0331 |
| 10,565,974 B1* | 2/2020 | Bhatia | ............... | G11B 33/08 |
| 10,856,434 B2* | 12/2020 | Waters | ............... | H05K 7/20727 |
| 2003/0156385 A1* | 8/2003 | Askeland | ............... | H01L 23/467 |
| | | | | 257/E23.099 |
| 2006/0104027 A1* | 5/2006 | Vinson | ............... | G06F 1/20 |
| | | | | 361/695 |
| 2019/0159361 A1* | 5/2019 | Chen | ............... | G10K 11/162 |
| 2022/0366887 A1* | 11/2022 | Gerdes | ............... | G10K 11/168 |
| 2023/0317045 A1* | 10/2023 | Chen | ............... | G10K 11/161 |
| | | | | 181/198 |
| 2024/0040736 A1* | 2/2024 | Escamilla | ............... | G10K 11/161 |
| 2024/0040738 A1* | 2/2024 | Peterson | ............... | H05K 7/20145 |

\* cited by examiner

*Primary Examiner* — Robert J Hoffberg
(74) *Attorney, Agent, or Firm* — McDermott Will & Emery LLP

(57) ABSTRACT

A computing chassis, including hard disk drives positioned at a first end of the chassis; a fan module positioned at a second end of the chassis; a first baffle having acoustic absorbing material, the first baffle extending between a first and a second side of the chassis, wherein the first and second sides of the chassis extend between the first and the second ends of the chassis, the first baffle spaced-apart from the fan module a first distance; a second baffle having acoustic absorbing material, the second baffle extending between the first and the second side of the chassis, the second baffle spaced-apart from the fan module a second distance greater than the first distance, wherein the first and the second baffle extend between the first and second sides of the chassis perpendicular to an airflow, and the acoustic absorbing material of the baffles attenuate acoustic waves.

13 Claims, 9 Drawing Sheets

COMPUTING CHASSIS INCLUDING ACOUSTICAL BAFFLES

BACKGROUND

Field of the Disclosure

The disclosure relates generally to an information handling system, and in particular, a computing chassis for the information handling system that includes acoustical baffles.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Internal components of hard disk drives (HDDs) are highly susceptible to acoustically-induced vibration. For example, read/write components are disrupted causing performance loss and potentially HDD failure. Additionally, HDDs are becoming more sensitive with capacity as demand for storage density increases. However, current information handling systems include extreme air movers to maintain cooling that induces the undesired vibrations.

SUMMARY

Innovative aspects of the subject matter described in this specification may be embodied in a computing chassis, including: one or more hard disk drives positioned at a first end of the chassis; a fan module positioned at a second end of the chassis opposite to the first end of the chassis; a first baffle having acoustic absorbing material, the first baffle extending between a first and a second side of the chassis, the first side opposite to the second side, wherein the first and second sides of the chassis extend between the first and the second ends of the chassis, the first baffle spaced-apart from the fan module a first distance; and a second baffle having acoustic absorbing material, the second baffle extending between the first and the second side of the chassis, the second baffle spaced-apart from the fan module a second distance greater than the first distance, wherein the fan module moves air from the first end of the chassis to the second end of the chassis creating an airflow, wherein the first and the second baffle extend between the first and second sides of the chassis perpendicular to the airflow, and the acoustic absorbing material of the first and the second baffle attenuate acoustic waves generated by the fan module that propagate from the fan module towards the hard disk drives.

Other embodiments of these aspects include corresponding methods, systems and apparatus.

These and other embodiments may each optionally include one or more of the following features. For instance, the chassis further includes a top surface and a bottom surface positioned opposite to the top surface, the top and the bottom surfaces extending between the first end of the chassis and the second end of the chassis, and extending between the first and the second sides of the chassis, wherein a first end of the first baffle is coupled to the bottom surface of the chassis and a first end of the second baffle is positioned proximate to the top surface of the chassis. A second end of the first baffle, opposite to the first end of the first baffle, is spaced-apart from a second end of the second baffle, opposite to the first end of the second baffle, a third-distance. The fan module moves air from the first end of the chassis to the second end of the chassis creating the airflow between the second ends of the first and the second baffles and a gap formed by the third distance. The first and the second baffle attenuate acoustic waves down to a frequency of approximately 1000 Hz. The first and the second baffle absorb acoustic energy of acoustic waves. Increasing the speed in revolutions per minute (RPM) of the fan module to compensate for an impedance to the airflow by the first and the second baffle is associated with an increased sound pressure level (decibels, dB) of the acoustic waves. The increase in sound pressure level (decibels) of the acoustic waves is approximated by $50\times \log_{10}$ (ratio of RPMs), wherein the ratio of RPMs is the i) RPM of the fan module after increase of the RPMs to ii) RPM of the fan module prior to increase of the RPMs.

Particular implementations of the subject matter described in this specification can be implemented so as to realize one or more of the following advantages. For example, for a same bulk air flow, an acoustical profile is reduced while minimizing impedance to airflow of the computing chassis.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
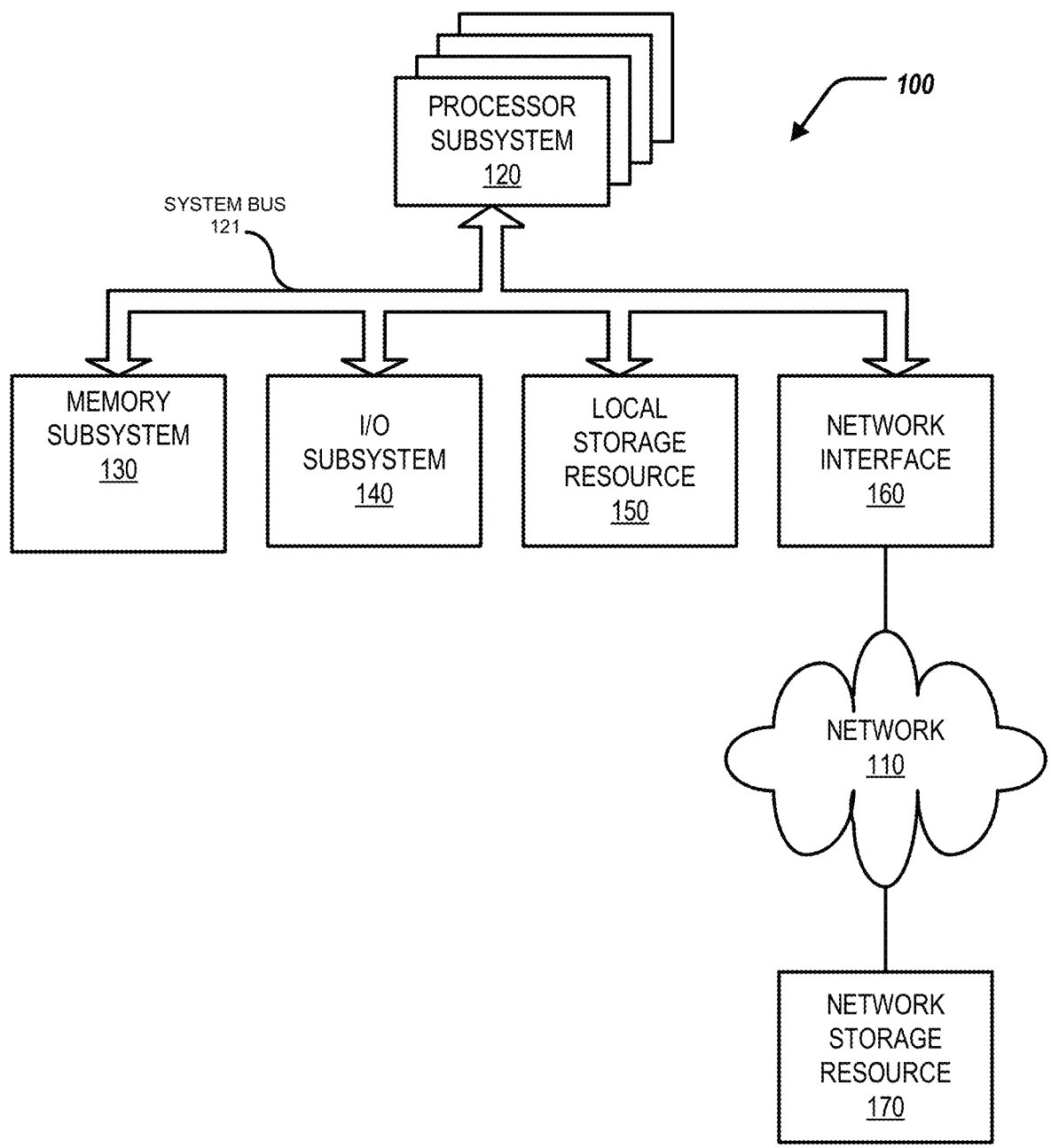
FIG. 1 is a block diagram of selected elements of an embodiment of an information handling system.

This disclosure discusses a computing chassis for the information handling system including acoustical baffles. In short, a fan module of the information handling system can facilitate cooling of computing components of the information handling system. During such cooling, the fan module can generate acoustical waves (vibrations) that can be detrimental to the performance of the computing components. To that end, a chassis of the information handling system can include a set of baffles that include acoustically absorbing material. The baffles can be positioned within a path of the acoustical waves, and in particular, perpendicular to an airflow generated by the fan module. The particular arrangement of the baffles can attenuate the acoustic waves that reach the computing components (minimizing impact of the vibrations on the computing components), while minimizing impedance to airflow.

Specifically, this disclosure discusses a computing chassis including one or more hard disk drives positioned at a first end of the chassis; a fan module positioned at a second end of the chassis opposite to the first end of the chassis; a first baffle having acoustic absorbing material, the first baffle extending between a first and a second side of the chassis, the first side opposite to the second side, wherein the first and second sides of the chassis extend between the first and the second ends of the chassis, the first baffle spaced-apart from the fan module a first distance; and a second baffle having acoustic absorbing material, the second baffle extending between the first and the second side of the chassis, the second baffle spaced-apart from the fan module a second distance greater than the first distance, wherein the fan module moves air from the first end of the chassis to the second end of the chassis creating an airflow, wherein the first and the second baffle extend between the first and second sides of the chassis perpendicular to the airflow, and the acoustic absorbing material of the first and the second baffle attenuate acoustic waves generated by the fan module that propagate from the fan module towards the hard disk drives.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-8 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a fan module of the information handling system 100 can facilitate cooling of computing components of the information handling system 100. During such cooling, the fan module can generate acoustical waves (vibrations) that can be detrimental to the performance of the computing components. To that end, a chassis of the information handling system 100 can include a set of baffles that include acoustically absorbing material. The baffles can be positioned within a path of the acoustical waves, and in particular, perpendicular to an airflow generated by the fan module. The particular arrangement of the baffles can attenuate the acoustic waves that reach the computing components (minimizing impact of the vibrations on the computing components), while minimizing impedance to airflow.

Figure 2:
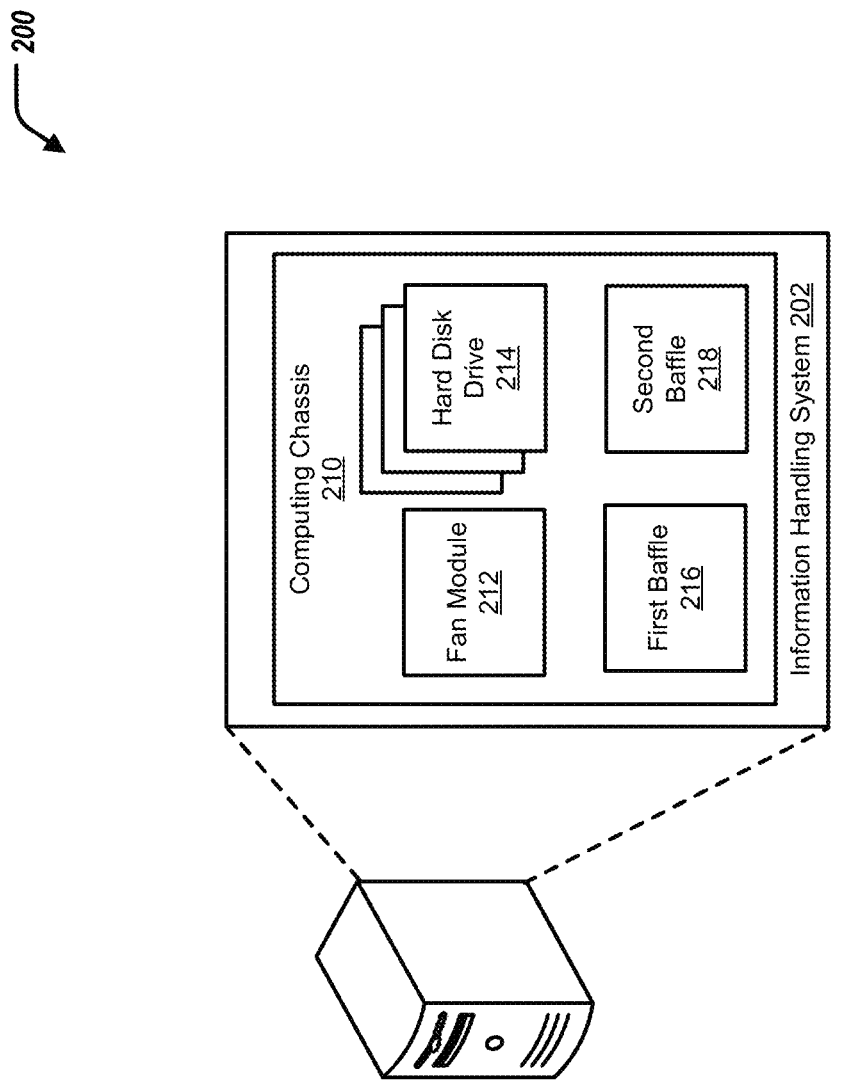
FIG. 2 illustrates a block diagram of an information handling system including the chassis and baffles.

Turning to FIG. 2, FIG. 2 illustrates an environment 200 including an information handling system 202. The information handling system 202 can include a computing chassis 210. The computing chassis 210 (or chassis 210) can include a fan module 212, hard disk drives 214, a first baffle 216, and a second baffle 218. In some examples, the information handling system 202 is similar to, or includes, the information handling system 100 of FIG. 1.

The chassis 210 can include any number of baffles.

Figure 3:
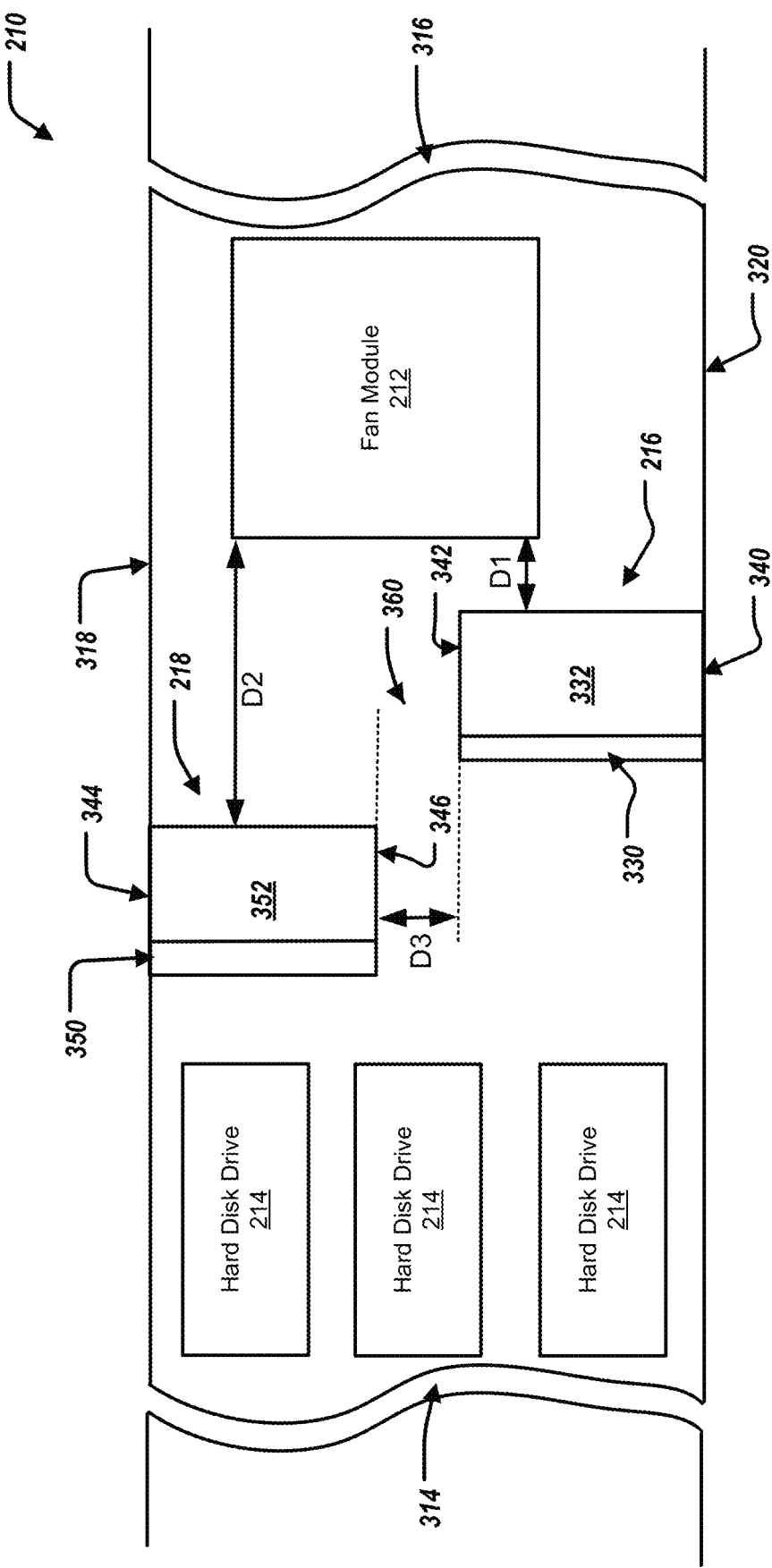
FIG. 3 illustrates a block diagram side view of the chassis.
Figure 4:
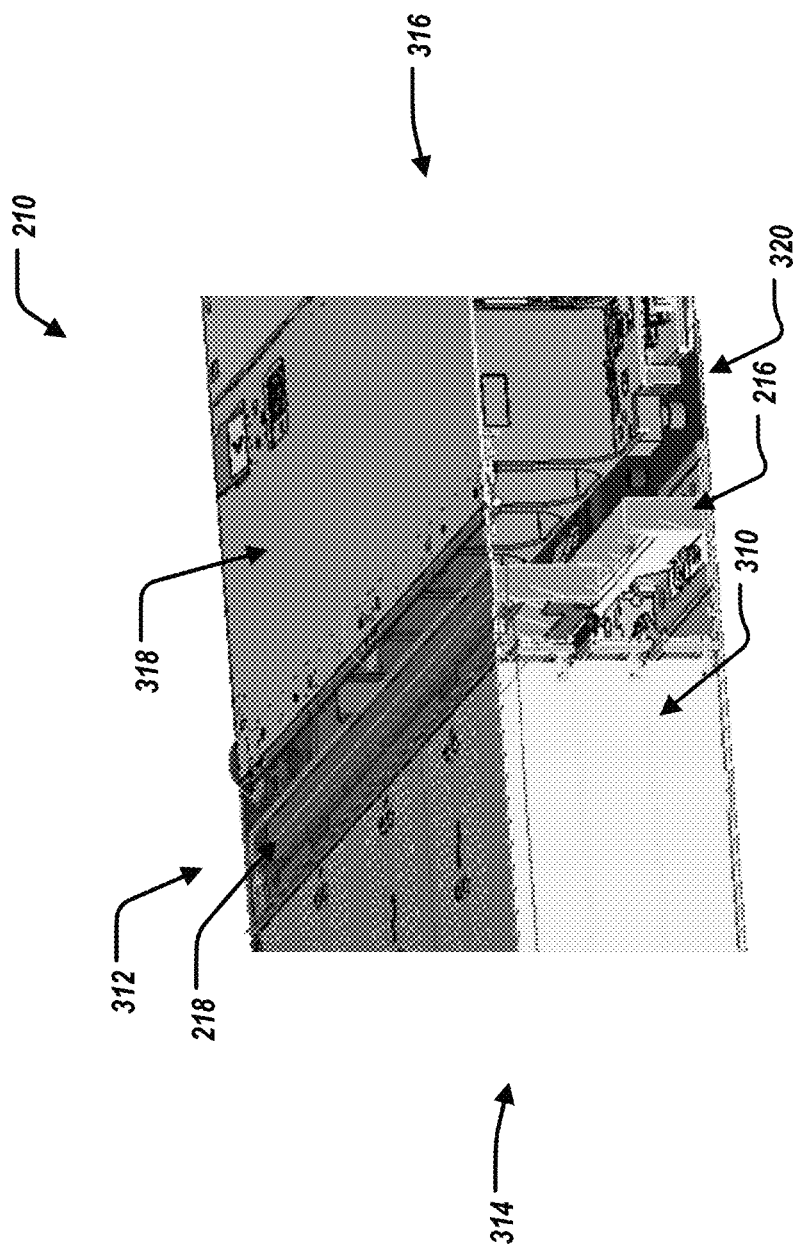
FIG. 4 illustrates a perspective view of the chassis.
Figure 5A:
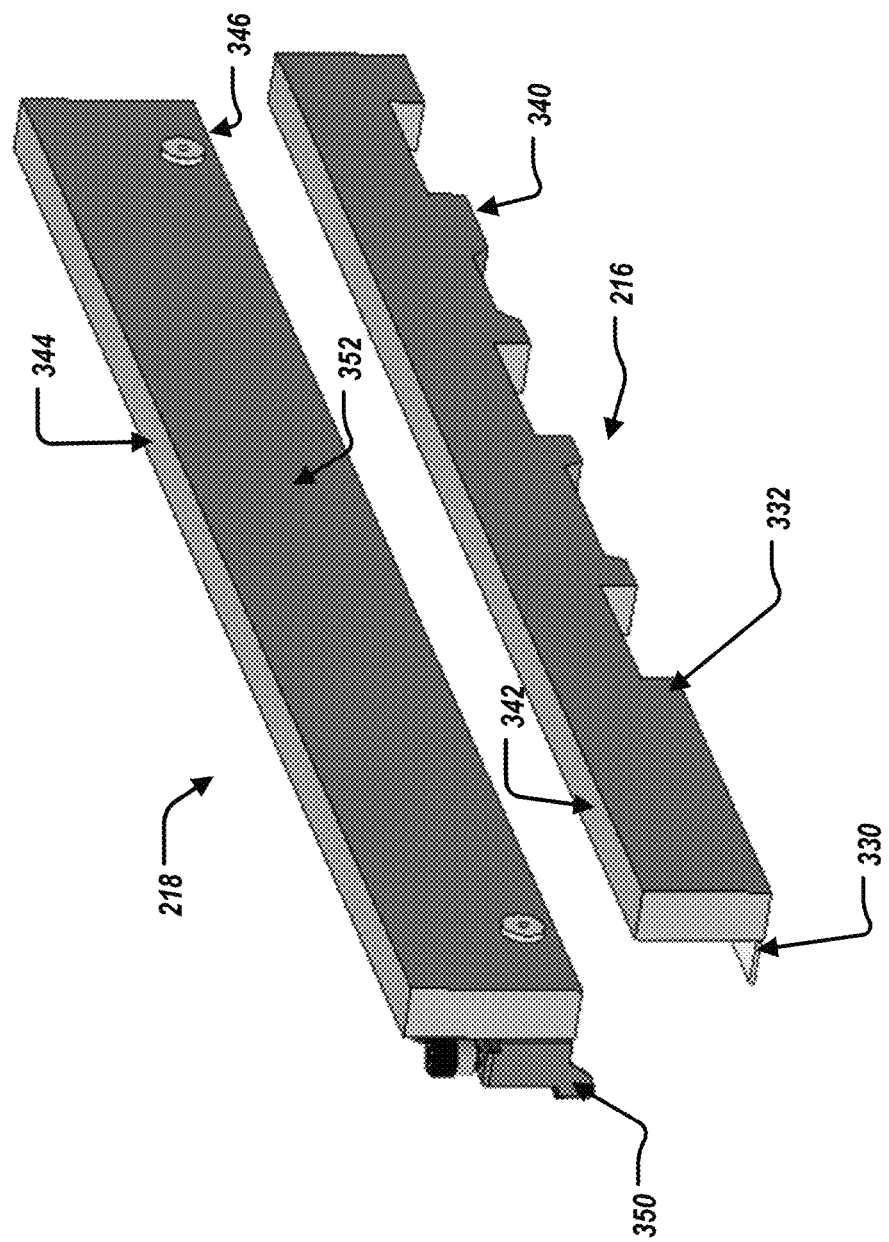
FIGS. 5A, 5B illustrates perspective views of the baffles.
Figure 5B:
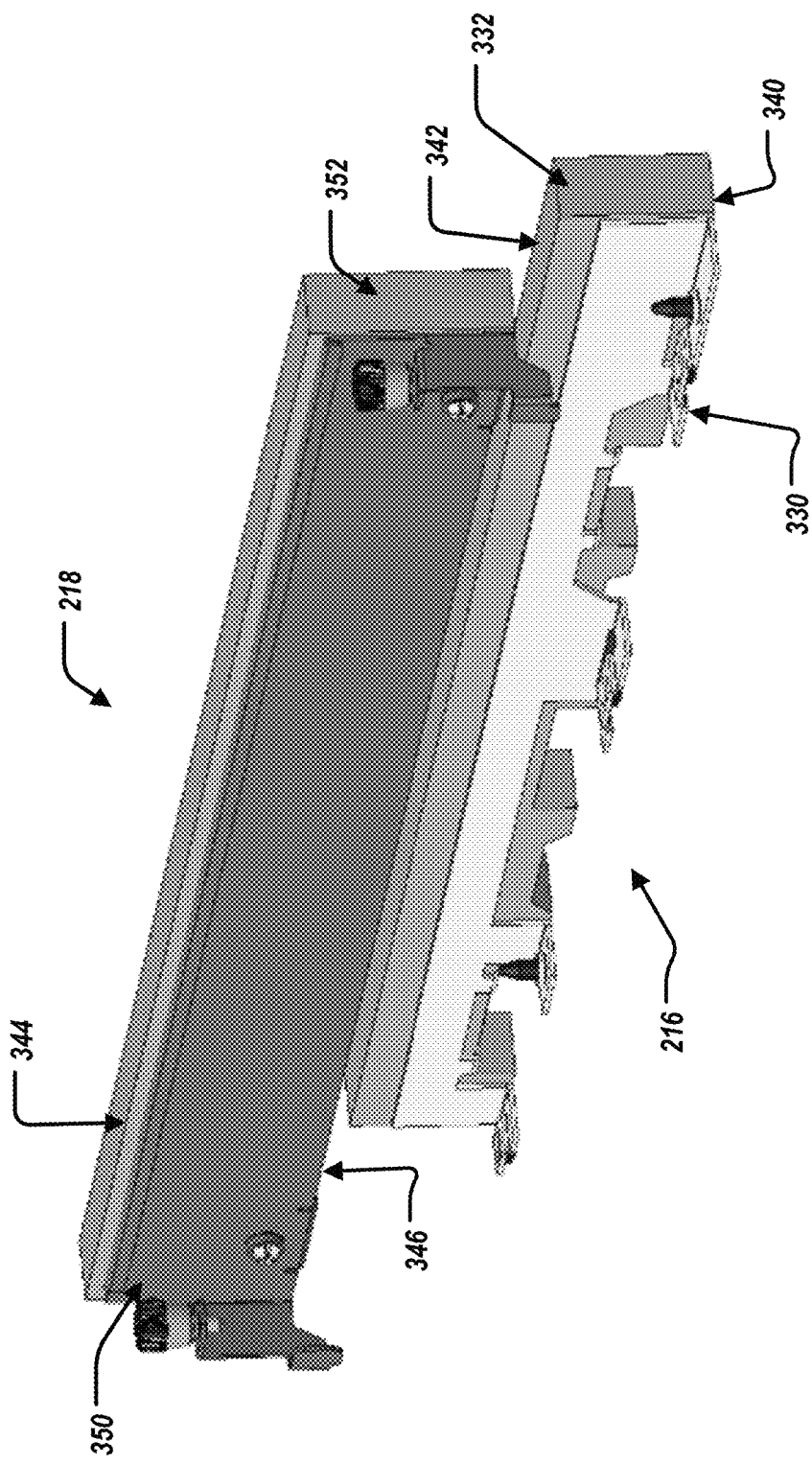

Referring to FIGS. 3 and 4, FIG. 3 illustrates a block diagram side view of a portion of the chassis 210; and FIG. 4 illustrates a perspective view of a portion of the chassis 210. The chassis 210 can include a first end 314 and a second end 316. The second end 316 of the chassis 210 is opposite to the first end 314 of the chassis 210.

The chassis 210 can include a first side 310 and a second side 312. The first side 310 is opposite to the second side 312. The first side 310 and the second side 312 of the chassis 210 can extend between the first end 314 and the second end 316 of the chassis 210.

The chassis 210 can include a top surface 318 and a bottom surface 320. The top surface 318 is opposite to the bottom surface 320. The top surface 318 and the bottom surface 320 extend between the first end 314 and the second end 316 of the chassis 210, and extend between the first side 310 and the second side 312 of the chassis 210.

The hard disk drives 214 can be positioned at (near or proximate) the first end 314 of the chassis 210. The fan module 212 can be positioned at (near or proximate) the second end 316 of the chassis 210.

The first baffle 216 can extend between the first side 310 and the second side 312 of the chassis 210. The first baffle 216 can be spaced-apart from the fan module 212 a first distance D1. The first baffle 216 can include a first end 340 and a second end 342. The first end 340 is opposite to the second end 342. The first baffle 216 can include a coupling element (bracket) 330 and acoustic absorbing material 332, additionally shown in FIGS. 5A, 5B. The coupling element 330 can be coupled to the acoustic absorbing material 332. The first end 340 of the first baffle 216 is positioned proximate to the bottom surface 320 of the chassis 210. In some cases, the first end 340 of the first baffle 216 is coupled to the bottom surface 320 of the chassis 210. In some cases, the bracket 330 couples the first baffle 216 and the acoustic absorbing material 332 to the chassis 210. For example, the bracket 330 couples the first baffle 216 and the acoustic absorbing material 332 to the bottom surface 320 of the chassis 210, or another structural element of the chassis 210.

The second baffle 218 can extend between the first side 310 and the second side 312 of the chassis 210. The second baffle 218 can be spaced-apart from the fan module 212 a second distance D2. The second distance D2 is greater than the first distance D1. The second baffle 218 can include a first end 344 and a second end 346. The first end 344 is opposite to the second end 346. The second baffle 218 can include a coupling element (bracket) 350 and acoustic absorbing material 352, additionally shown in FIGS. 5A, 5B. The coupling element 350 can be coupled to the absorbing material 352. The first end 344 of the second baffle 218 is positioned proximate to the top surface 318 of the chassis 210. In some cases, the first end 344 of the second baffle 218 is coupled to the top surface 318 of the chassis 210. In some cases, the bracket 350 couples the second baffle 218 and the acoustic absorbing material 352 to the chassis 210. For example, the bracket 350 couples the second baffle 218 and the acoustic absorbing material 352 to the top surface 318 of the chassis 210, or another structural element of the chassis 210.

In some examples, the second end 342 of the first baffle 216 is spaced-apart from the second end 346 of the second baffle 218 a third distance D3, defining a gap 360.

Figure 6:
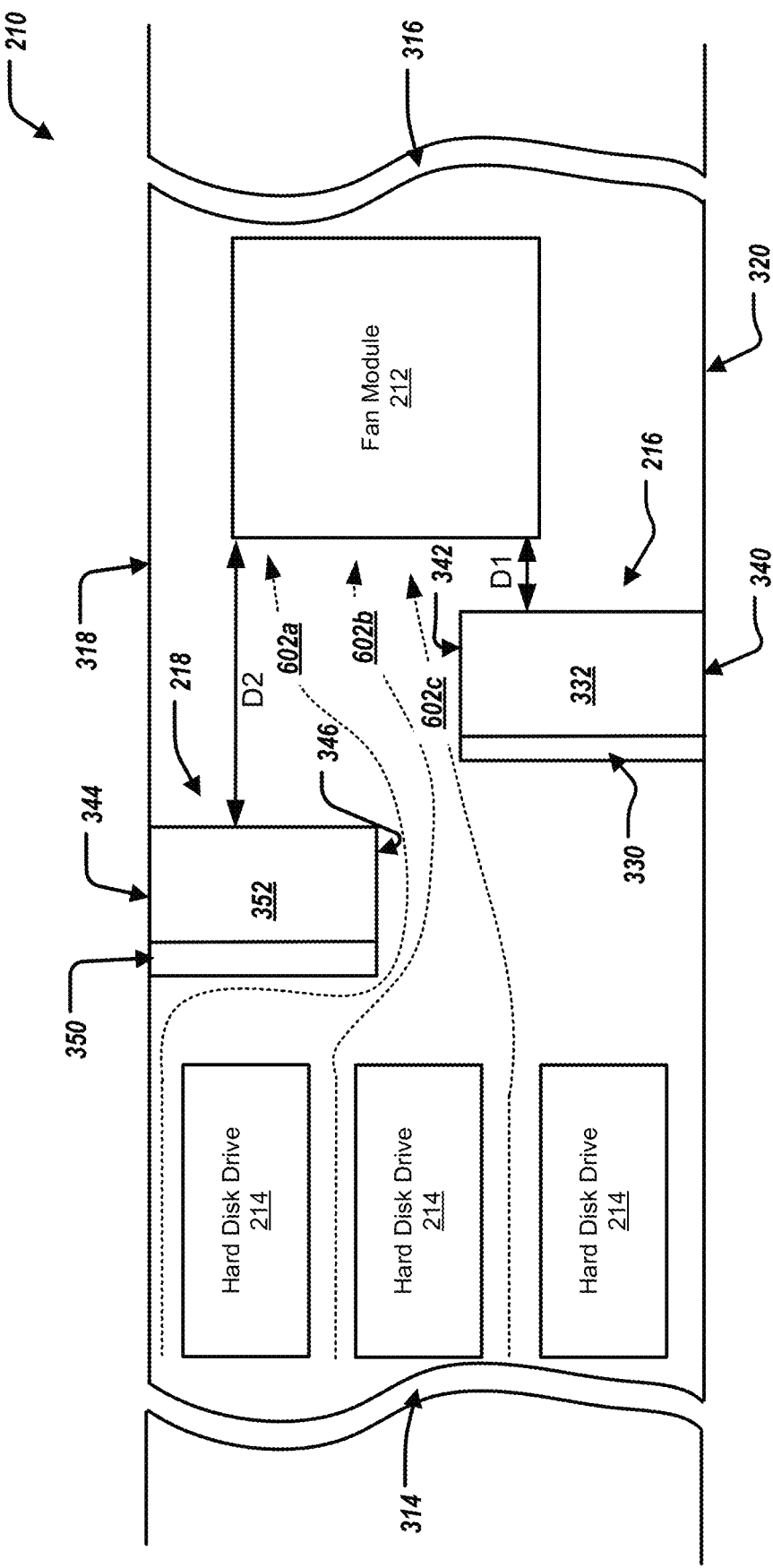
FIG. 6 illustrates a block diagram side view of the chassis, including an airflow.

FIG. 6 illustrates a block diagram side view of a portion of the chassis 210, including an airflow. Specifically, the fan module 212 can move air from the first end 314 of the chassis 210 to the second end 316 of the chassis 210, creating multiple airflows, shown as airflows 602a, 602b, 602c (or airflow 602). That is, the fan module 212 creates the airflow 602 between the second end 342 of the first baffle 216 and the second end 346 of the second baffle 218, and in particular, within the gap 360 (shown in FIG. 3). That is, by the first baffle 216 being spaced-apart from the fan module 212 by the first distance D1 and the second baffle 218 being spaced-apart from the fan module 212 by the second distance D2 (i.e., the baffles 216, 218 being offset from one another), the fan module 212 is able to create the airflow 602 from the first end 314 of the chassis 210 to the second end 316 of the chassis 210. The fan module 212 can continue to direct the airflow 602 proximate to heatsinks (not shown) located within the chassis 210 (to provide cooling to the information handling system 200).

Figure 7:
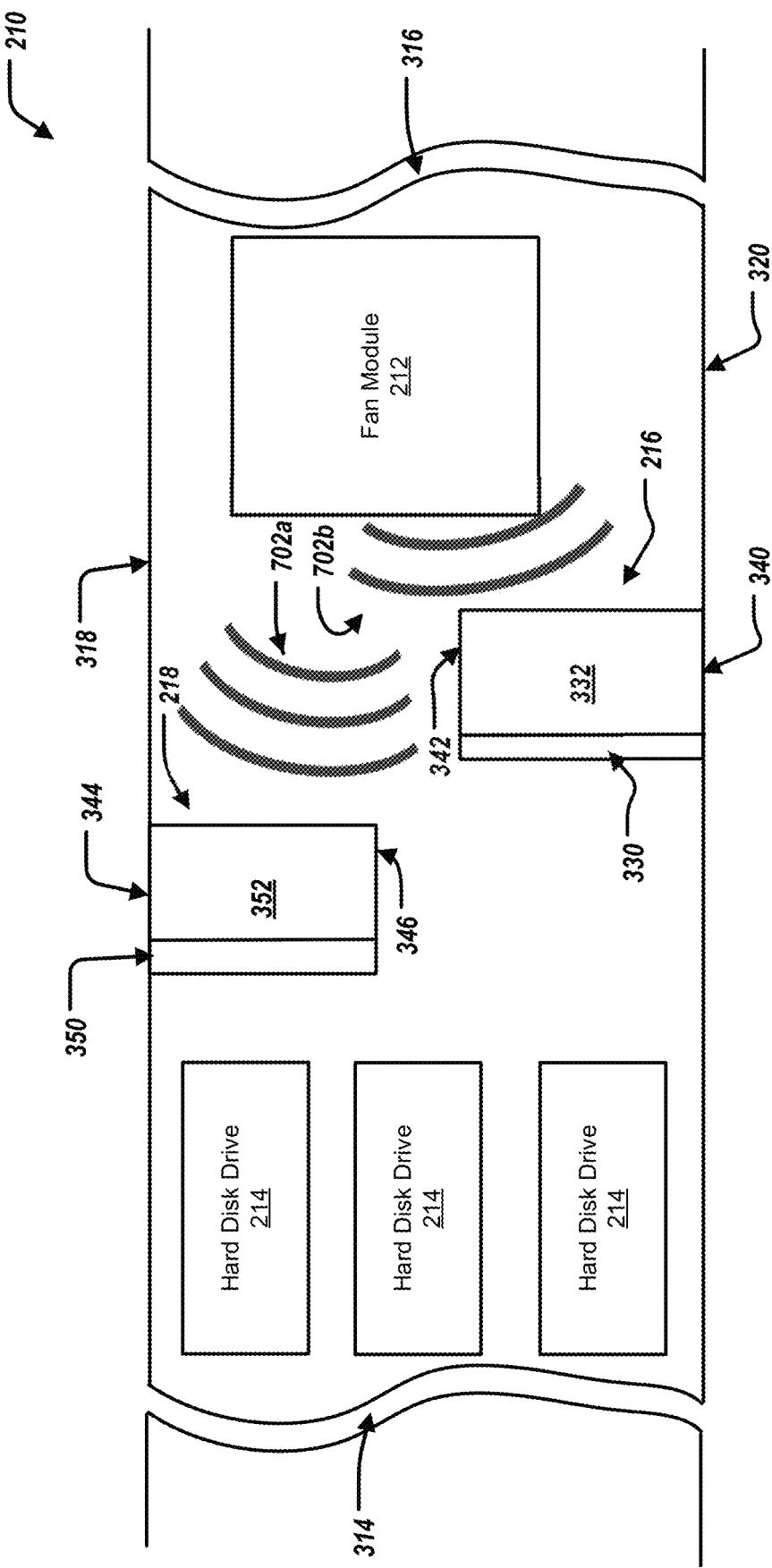
FIG. 7 illustrates a block diagram side view of the chassis, including acoustic waves.

Referring to FIG. 7, when the fan module 212 moves air from the first end 314 of the chassis 210 to the second end 316 of the chassis 210 creating the airflow 602, the fan module 212 can create/generate acoustic waves 702a and 702b (or waves 702) that propagate from the fan module 212 towards the hard disk drives 214.

To that end, as the first baffle 216 and the second baffle 218 extend between the first side 310 of the chassis 210 and the second side 312 of the chassis 210 (as shown in FIG. 4), the first baffle 216 and the second baffle 218 are perpendicular (extend perpendicularly) to the direction of flow of the airflow 602. As a result, the first baffle 216 and the second baffle 218 are located within the full acoustic wave propagation path of the acoustic waves 702. To that end, as the first baffle 216 and the second baffle 218 are located within the full acoustic wave propagation path of the acoustic waves 702, the acoustic absorbing material 332 of the first baffle 216 and the acoustic absorbing material 352 of the second baffle 218 can attenuate the acoustic waves 702. In some cases, the acoustic absorbing material 332 of the first baffle 216 and the acoustic absorbing material 352 of the second baffle 218 can partially or wholly absorb the acoustic energy of the acoustic waves 702. In some cases, the acoustic absorbing material 332 of the first baffle 216 and the acoustic absorbing material 352 of the second baffle 218 can attenuate the acoustic waves 702 that reach the second end 314 of the chassis 210 and/or the hard disk drives 214. In some cases, the acoustic absorbing material 332 of the first baffle 216 and the acoustic absorbing material 352 of the second baffle 218 can attenuate the acoustic waves 702 to minimize and/or prevent vibrations of the computing components 214.

In some cases, the acoustic absorbing material 332 of the first baffle 216 and the acoustic absorbing material 352 of the second baffle 218 can attenuate the acoustic waves 702 corresponding to frequencies less than 2000 Hz. In some cases, the acoustic absorbing material 332 of the first baffle 216 and the acoustic absorbing material 352 of the second baffle 218 can attenuate the acoustic waves 702 corresponding to frequencies between 1000 Hz and 2000 Hz. In some cases, the acoustic absorbing material 332 of the first baffle 216 and the acoustic absorbing material 352 of the second baffle 218 can attenuate the acoustic waves 702 corresponding to frequencies of approximately 1000 Hz.

In some cases, the acoustic absorbing material 332 of the first baffle 216 and the acoustic absorbing material 352 of the second baffle 218 can attenuate the acoustic waves 702 to reduce an acoustical profile of the chassis 210/fan module 212 by approximately 4 decibels (dB). That is, for a same (or similar) bulk airflow of the airflow 602, the acoustic absorbing material 332 of the first baffle 216 and the acoustic absorbing material 352 of the second baffle 218 can attenuate the acoustic waves 702 to reduce an acoustical profile of the chassis 210/fan module 212 by approximately 4 dB.

Continuing the example, the baffles 216, 218 can cause an impedance of the airflows 602. To compensate for such impedance, a speed of the fan module 212 (e.g., revolutions per minute (RPM) of the fan module 212) can be increased to increase the movement of the airflows 602 (bulk airflow of the airflow 602) to a desired level. However, such increase in speed of the fan module 212 can further increase sound pressure levels (decibels, dB) of the waves 702. Such increase in sounds pressure level of the waves 702 can be approximated by the equation:

$$y(dB) \sim 50 \times \log_{10}(\text{ratio of RPMs}) \quad [1]$$

wherein the ratio of RPMs is i) the RPM of the fan module 212 after increase to ii) the RPM of the fan module 212 prior to increase. To that end, the overall reduction in sound pressure level is determined by contrast of the sound pressure attenuation from the baffles 216, 218 to the sound pressure level increase of the waves 702 (dB) attributable to the fan module 212 speed compensation to airflow impedance.

Figure 8:
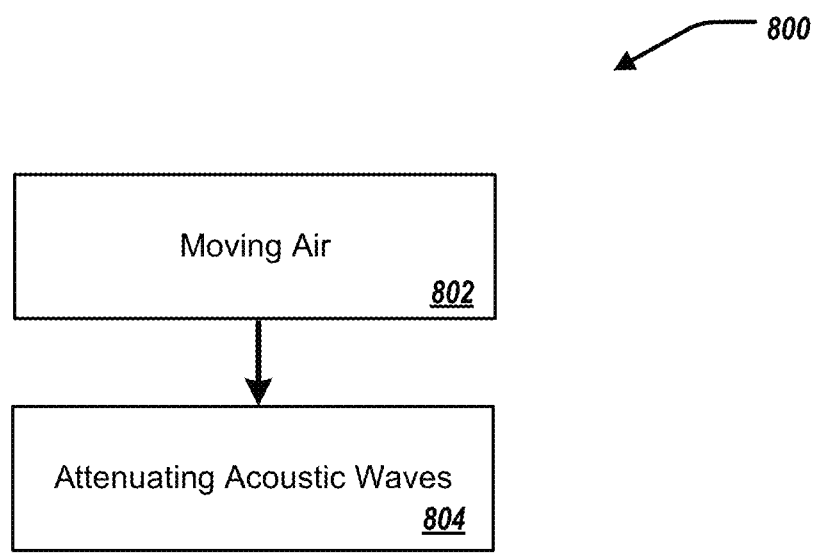
FIG. 8 illustrates a method for attenuating acoustic waves.

FIG. 8 illustrates a flowchart depicting selected elements of an embodiment of a method 800 for attenuating acoustic waves. The method 800 may be performed by the information handling system 100, the information handling system 202, the fan module 212, and/or the baffles 216, 218 with reference to FIGS. 1-7. It is noted that certain operations described in method 800 may be optional or may be rearranged in different embodiments.

The fan module 212 moves air from the first end 314 of the chassis 210 to the second end 316 of the chassis 210 to create the airflow 602 (802). The acoustic absorbing material 332 of the first baffle 216 and the acoustic absorbing material 352 of the second baffle 218 attenuate the acoustic waves 702 that propagate from the fan module 212 towards the hard disk drive 214 (804).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computing chassis, including:
a top surface and a bottom surface positioned opposite to the top surface, the top surface and the bottom surface extending between a first end of the computing chassis and a second end of the computing chassis, and extending between a first side of the computing chassis and a second side of the computing chassis, the first side opposite to the second side;
one or more hard disk drives positioned at the first end of the computing chassis;
a fan module positioned at the second end of the computing chassis;
a first baffle having an acoustic absorbing material, the first baffle extending entirely between the first side of the computing chassis and the second side of the computing chassis, the first baffle spaced-apart from the fan module by a first distance, wherein a first end of the first baffle is attached to the bottom surface of the computing chassis; and
a second baffle having acoustic absorbing material, the second baffle extending entirely between the first side of the computing chassis and the second side of the computing chassis, the second baffle spaced-apart from the fan module by a second distance, the second distance greater than the first distance, wherein a first end of the second baffle is attached to the top surface of the computing chassis,
wherein the fan module moves air from the first end of the computing chassis to the second end of the computing chassis creating an airflow,
wherein the first baffle and the second baffle extend entirely between the first side of the computing chassis and the second side of the computing chassis perpendicular to the airflow, and the acoustic absorbing material of the first baffle and the acoustic absorbing material of the second baffle attenuate acoustic waves generated by the fan module that propagate from the fan module towards the one or more hard disk drives,
wherein the first baffle extends in a first plane, the first plane extends between the first end of the first baffle to a second end of the first baffle, and the first plane is perpendicular to the bottom surface,
wherein the second baffle extends in a second plane, the second plane extends between the first end of the second baffle to a second end of the second baffle, and the second plane is perpendicular to the top surface,
wherein the first plane of the first baffle is spaced-apart from the second plane of the second baffle by a gap between the first plane of the first baffle and the second plane of the second baffle, and
wherein a sum of a distance along the first plane from the first end of the first baffle to the second end of the first baffle and a distance along the second plane from the first end of the second baffle to the second end of the second baffle is less than a height perpendicular to the top surface between the top surface and the bottom surface.

2. The computing chassis of claim 1, wherein the fan module moves the air from the first end of the computing chassis to the second end of the computing chassis creating the airflow in the gap between the second ends of the first and the second baffles.

3. The computing chassis of claim 1, wherein each of the first baffle and the second baffle attenuate the acoustic waves down to a frequency of 1000 Hz.

4. The computing chassis of claim 1, wherein the first baffle and the second baffle absorb acoustic energy of the attenuated acoustic waves.

5. An information handling system, comprising:
a computing chassis, including:
a top surface and a bottom surface positioned opposite to the top surface, the top surface and the bottom surface extending between a first end of the computing chassis and a second end of the computing chassis, and extending between a first side of the computing chassis and a second side of the computing chassis, the first side opposite to the second side;
one or more hard disk drives positioned at the first end of the computing chassis;
a fan module positioned at the second end of the computing chassis opposite to the first end of the computing chassis;

a first baffle having an acoustic absorbing material, the first baffle extending entirely between the first side of the computing chassis and the second side of the computing chassis, wherein the first and second sides of the computing chassis extend between the first and the second ends of the computing chassis, the first baffle spaced-apart from the fan module by a first distance, wherein a first end of the first baffle is attached to the bottom surface of the computing chassis; and a second baffle having an acoustic absorbing material, the second baffle extending entirely between the first side of the computing chassis and the second side of the computing chassis, the second baffle spaced-apart from the fan module by a second distance, the second distance greater than the first distance, wherein a first end of the second baffle is attached to the top surface of the computing chassis, wherein the fan module moves air from the first end of the computing chassis to the second end of the computing chassis creating an airflow, wherein the first baffle and the second baffle extend entirely between the first side of the computing chassis and the second side of the computing chassis perpendicular to the airflow, and the acoustic absorbing material of the first baffle and the acoustic absorbing material of the second baffle attenuate acoustic waves generated by the fan module that propagate from the fan module towards the one or more hard disk drives, wherein the first baffle extends in a first plane, the first plane extends between the first end of the first baffle to a second end of the first baffle, and the first plane is perpendicular to the bottom surface, wherein the second baffle extends a second plane, the second plane extends between the first end of the second baffle to a second end of the second baffle, and the second plane is perpendicular to the top surface, wherein the first plane of the first baffle is spaced-apart from the second plane of the second baffle by a gap between the first plane of the first baffle and the second plane of the second baffle, and wherein a sum of a distance along the first plane from the first end of the first baffle to the second end of the first baffle and a distance along the second plane from the first end of the second baffle to the second end of the second baffle is less than a height perpendicular to the top surface between the top surface and the bottom surface.

6. The information handling system of claim 5, wherein the fan module moves the air from the first end of the computing chassis to the second end of the computing chassis creating the airflow in the gap between the second ends of the first and the second baffles.

7. The information handling system of claim 5, wherein each of the first baffle and the second baffle attenuate the acoustic waves down to a frequency of 1000 Hz.

8. The information handling system of claim 5, wherein the first baffle and the second baffle absorb acoustic energy of the attenuated acoustic waves.

9. A method, comprising:
moving, by a fan module, air from a first end of a computing chassis to a second end of the computing chassis creating an airflow, wherein the first end of the computing chassis is opposite to the second end of the computing chassis, with one or more hard disk drives positioned at the first end of the computing chassis and the fan module positioned at the second end of the computing chassis to move the air; and attenuating acoustic waves, by an acoustic absorbing material of a first baffle and an acoustic absorbing material of a second baffle, generated by the fan module that propagate from the fan module towards the one or more hard disk drives, wherein the first baffle extends entirely between a first side of the computing chassis and a second side of the computing chassis, the first side opposite to the second side, wherein the first side and the second side of the computing chassis extend between the first end and the second end of the computing chassis, the first baffle spaced-apart from the fan module by a first distance, a first end of the first baffle is attached to a bottom surface of the computing chassis, the bottom surface of the computing chassis extending between the first end of the computing chassis and the second end of the computing chassis, and extending between the first side of the computing chassis and the second side of the computing chassis, wherein the second baffle extends between the first side and the second side of the computing chassis, the second baffle spaced-apart from the fan module by a second distance, the second distance greater than the first distance, a first end of the second baffle is attached to a top surface of the computing chassis, the top surface of the computing chassis extending between the first end of the computing chassis and the second end of the computing chassis, and extending between the first side of the computing chassis and the second side of the computing chassis, the bottom surface opposite to the top surface, wherein the first baffle and the second baffle extend entirely between the first and the second sides of the computing chassis perpendicular to the airflow, wherein the first baffle extends in a first plane, the first plane extends between the first end of the first baffle to a second end of the first baffle, and the first plane is perpendicular to the bottom surface, wherein the second baffle extends in a second plane, the second plane extends between the first end of the second baffle to a second end of the second baffle, and the second plane is perpendicular to the top surface, wherein the first plane of the first baffle is spaded-apart from the second plane of the second baffle by a gap between the first plane of the first baffle and the second plane of the second baffle, and wherein a sum of a distance along the first plane from the first end of the first baffle to the second end of the first baffle and a distance along the second plane from the first end of the second baffle to the second end of the second baffle is less than a height perpendicular to the top surface between the top surface and the bottom surface.

10. The method of claim 9, wherein attenuating the acoustic waves includes attenuating the acoustic waves down to a frequency of 1000 Hz.

11. The method of claim 9, further comprising:
increasing a revolutions per minute (RPM) of the fan module to compensate for an impedance to the airflow by the first baffle and the second baffle.

12. The method of claim 11, wherein the increased RPM of the fan module is associated with an increased sound pressure level (decibels) of the attenuated acoustic waves.

13. The method of claim 12, wherein the attenuation is greater than the increase in sound pressure level (decibels) of the attenuated acoustic waves by $50 \times \log_{10}$ (a ratio of RPMs), wherein the ratio of the RPMs is the RPM of the fan module after increase of the RPMs to the RPM of the fan module prior to increase of the RPMs.

* * * * *